(12) United States Patent
Neer et al.

(10) Patent No.: US 10,039,208 B2
(45) Date of Patent: Jul. 31, 2018

(54) METHOD FOR COOLING A CONNECTOR SYSTEM

(71) Applicant: Molex, LLC, Lisle, IL (US)

(72) Inventors: Jay H. Neer, Boca Raton, FL (US); Kent E. Regnier, Lombard, IL (US); Cleaver Brinkerhoff, Park Ridge, IL (US); Harold Keith Lang, Cary, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 14/953,927

(22) Filed: Nov. 30, 2015

(65) Prior Publication Data

US 2016/0081221 A1    Mar. 17, 2016

Related U.S. Application Data

(63) Continuation of application No. 13/704,175, filed as application No. PCT/US2011/040155 on Jun. 13, 2011, now Pat. No. 9,246,280.

(60) Provisional application No. 61/355,030, filed on Jun. 15, 2010.

(51) Int. Cl.
| | |
|---|---|
| *H05K 7/20* | (2006.01) |
| *G02B 6/42* | (2006.01) |
| *H01R 13/66* | (2006.01) |
| *H01R 12/70* | (2011.01) |

(52) U.S. Cl.
CPC ....... *H05K 7/20145* (2013.01); *G02B 6/4246* (2013.01); *G02B 6/4261* (2013.01); *G02B 6/4268* (2013.01); *G02B 6/4269* (2013.01); *G02B 6/4284* (2013.01); *H01R 12/7005* (2013.01); *H01R 13/665* (2013.01); *H05K 7/2039* (2013.01); *Y10T 403/60* (2015.01)

(58) Field of Classification Search
CPC ... H01L 23/427; H01L 23/473; H01L 23/467; H01L 2023/4062; H01L 2225/06589; H01L 23/367; H05K 7/20145; H05K 7/2039; G02B 6/4246; G02B 6/4261; G02B 6/4268; G02B 6/4269; G02B 6/4284; H01R 12/7005; H01R 13/665; Y10T 403/60
See application file for complete search history.

(56) References Cited

U.S. PATENT DOCUMENTS

| | | |
|---|---|---|
| 6,655,995 B1 | 12/2003 | Reisinger et al. |
| 6,980,437 B2 | 12/2005 | Bright |
| 7,539,018 B2 * | 5/2009 | Murr ............... H05K 7/20418 165/185 |
| 7,704,097 B1 * | 4/2010 | Phillips ............ H01R 13/7172 439/607.01 |
| 7,780,361 B2 | 8/2010 | Harris |
| 8,449,203 B2 | 5/2013 | Downs |

(Continued)

*Primary Examiner* — Robert J Hoffberg
*Assistant Examiner* — Hung Dang
(74) *Attorney, Agent, or Firm* — Jeffrey K. Jacobs

(57) ABSTRACT

A cage can include a thermal plate positioned so as to be aligned with a bottom of a channel. An adjustable biasing system is provided to urge a module toward the thermal plate. The adjustable biasing system may be a riding heat sink. The thermal plate may include a fin to help increase its surface area. A housing with a card slot aligned with the channel can be provided in the cage to provide a receptacle that has a card slot aligned with the channel. A receptacle so configured allows for greater thermal energy to be removed from a module.

6 Claims, 17 Drawing Sheets

(56) References Cited

U.S. PATENT DOCUMENTS

2003/0161108 A1 8/2003 Bright et al.
2008/0285236 A1 11/2008 Phillips et al.
2009/0109627 A1 4/2009 Murr et al.

* cited by examiner

METHOD FOR COOLING A CONNECTOR SYSTEM

RELATED APPLICATIONS

This application is a continuation of U.S. Ser. No. 13/704,175, filed Mar. 25, 2013, now U.S. Pat. No. 9,246,280, which is a national phase application of PCT Application No. PCT/US11/40155, filed Jun. 13, 2011, which in turn claims priority to U.S. Provisional Application No. 61/355,030, filed Jun. 15, 2010, all of which are incorporated herein by reference in their entirety.

BACKGROUND OF THE INVENTION

Field of the Invention

The present invention relates to the field of input/output (I/O) connectors, more specifically to I/O connectors that handle higher amounts of power.

Description of Related Art

I/O connectors are commonly used in system architectures where it is desirable to pass information between two separate components via a flexible cable. Often a first connector will be mounted to a first circuit board and a second connector will be mounted to a second board and a cable with corresponding mating connectors will be plugged into the first and second connector so as to allow information to pass therebetween. Due to increased end-user needs, there has been a general interest in providing I/O connectors that can handle high data-rates (such as 10 Gbps and greater). Future I/O standards may include a 25 Gbps channel. This is expected to be beneficial, at least in part, because data rates of optical channels are suited to operate at 25 Gbps, thus allowing a one-to-one arrangement. For example, a 4X connector (where the X represents a transmit channel and a receive channel) that could operate at 25 Gbps would enable four two-way communication channels of 25 Gbps. While a passive cable would allow the signals to be transmitted for shorter distances, at the frequencies that tend to be used, a passive cable is unsuitable for long-distance communication. Such a 4x connector could therefore be coupled to an active module (either active copper or optical) so as to allow for increased cable lengths (optical cables offering the potential for lengths of a kilometer or more, for example).

One potential issue with such a solution, however, is that the use of active modules creates significant thermal energy. A module, for example, may need to dissipate more than 3 watts. If there is only one connector, the use of a convention riding heat sink can be sufficient. However, if the 4X connectors are ganged or stacked, it becomes much more challenging to cool the connectors. Therefore, certain individuals would appreciate an improved thermal solution.

BRIEF SUMMARY OF THE INVENTION

A cage includes a front face that includes a channel and a thermal plate forms a wall that extends from the front face along a bottom of the channel. An adjustable biasing system is provided to urge an inserted module toward the thermal plate. In an embodiment, the thermal plate supports a fin. In another embodiment, the thermal plate omits fins and is compatible with a convention circuit board layout. A housing with a card slot is positioned in the cage so that the card slot is aligned with the channel. In an embodiment, the adjustable biasing system may be a riding heat sink. A module with a edge card can be inserted in the cage so that the edge card is positioned in the card slot.

BRIEF DESCRIPTION OF THE DRAWINGS

The present invention is illustrated by way of example and not limited in the accompanying figures in which like reference numerals indicate similar elements and in which.

DETAILED DESCRIPTION OF THE INVENTION

Figure 1:
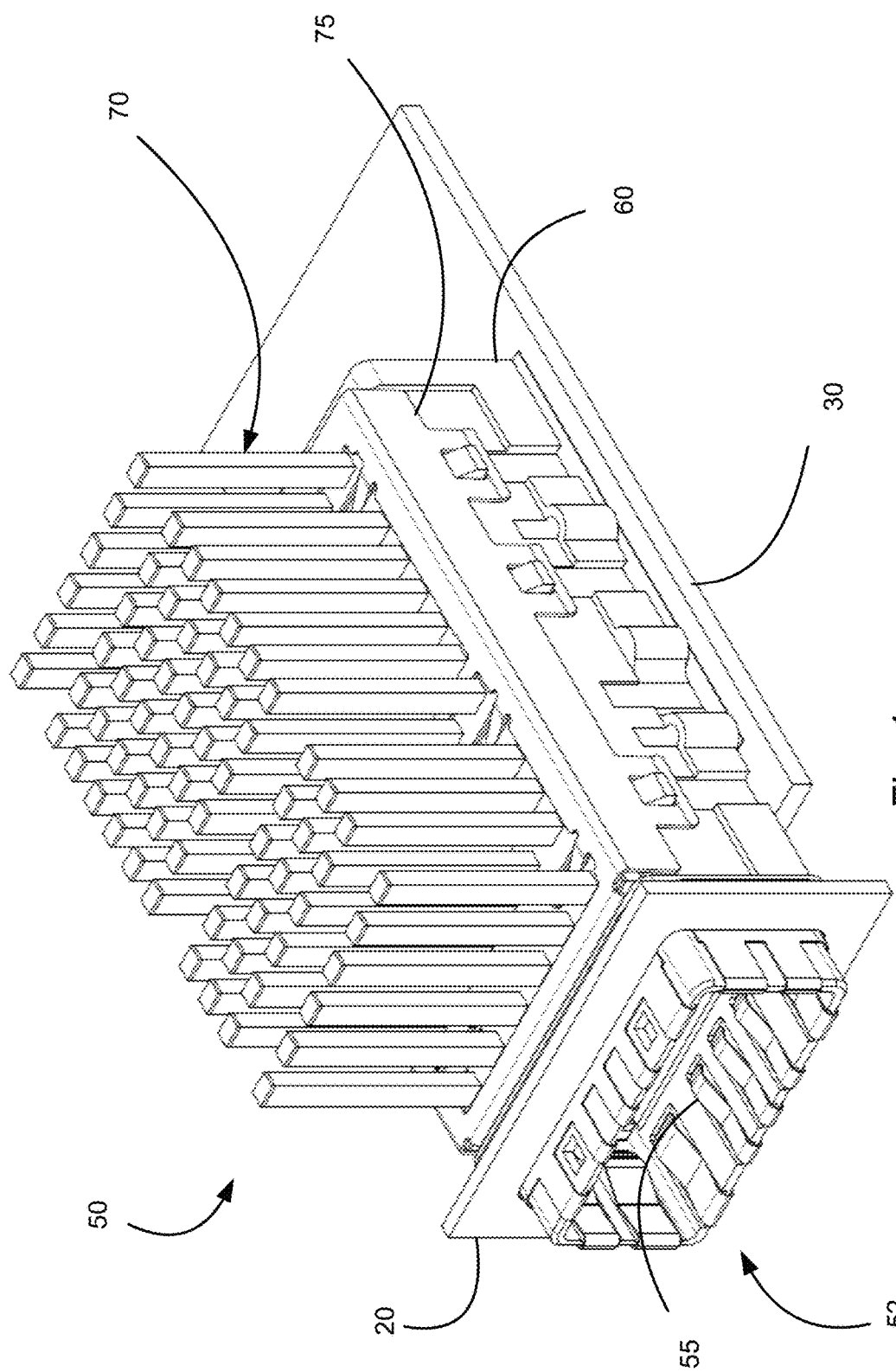
FIG. 1 illustrates a perspective view of an embodiment of a connector system.
Figure 2:
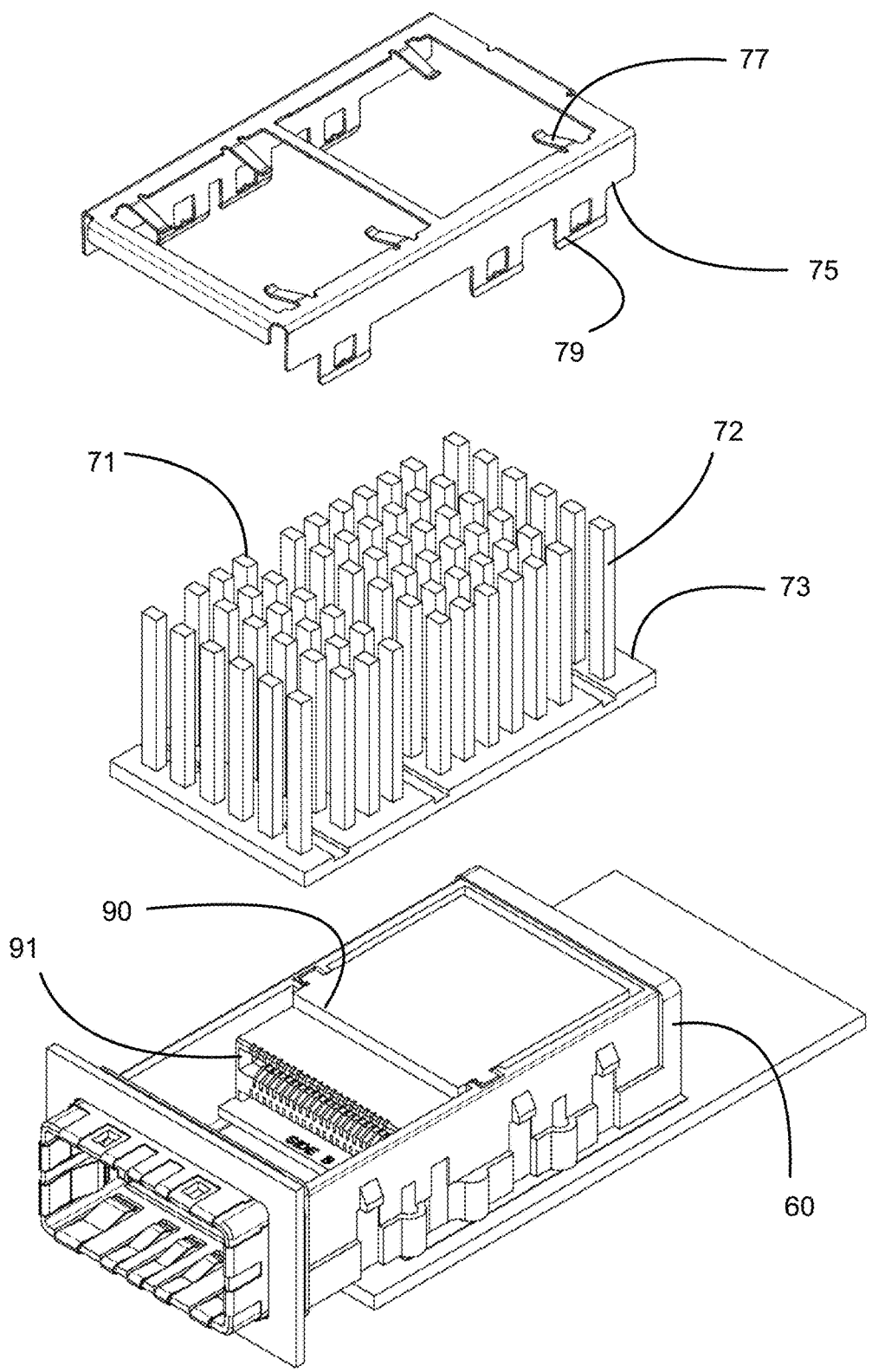
FIG. 2 illustrates a partially exploded perspective view of the connector system depicted in FIG. 1.
Figure 3:
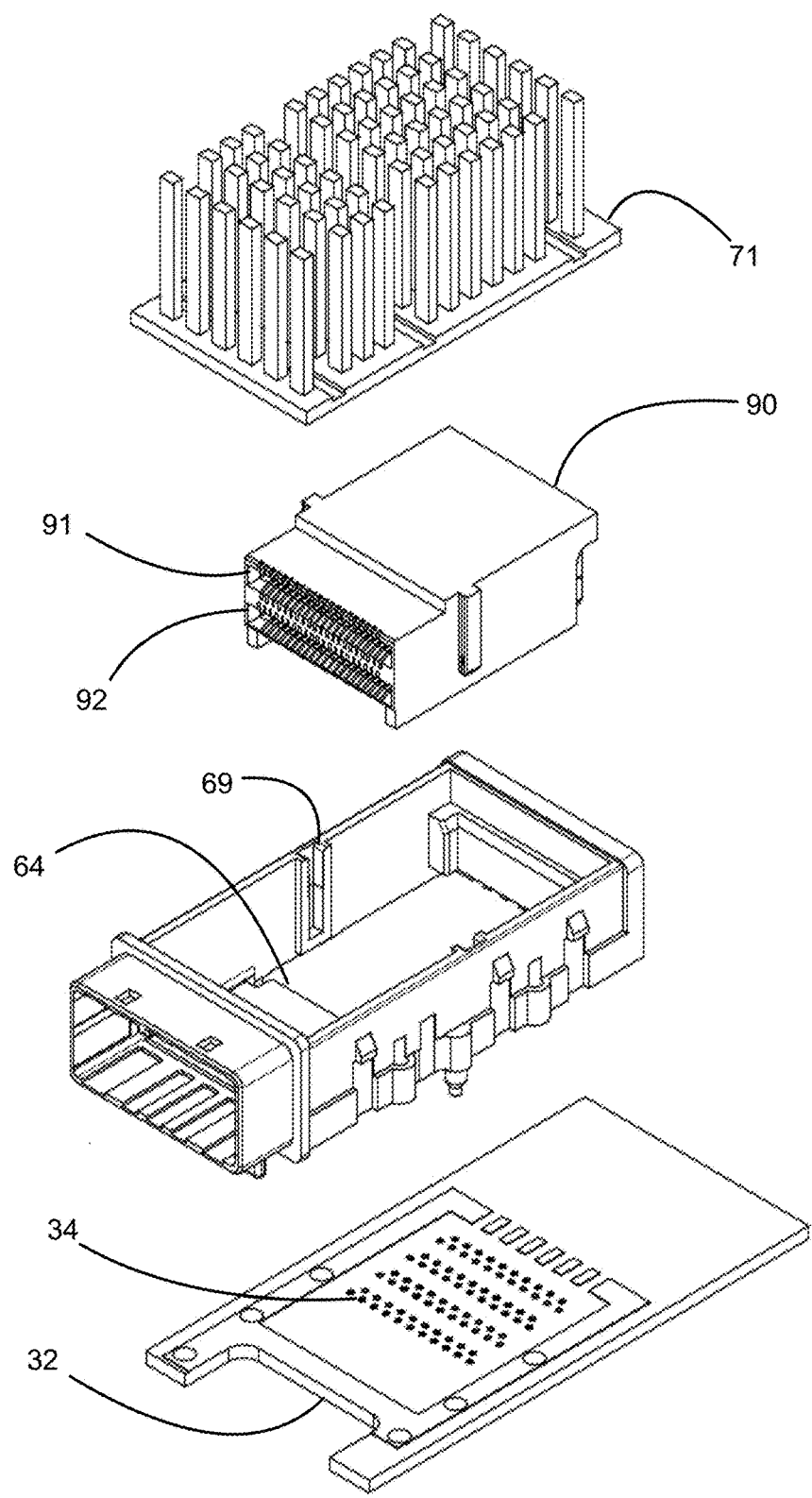
FIG. 3 illustrates a further exploded perspective view of the connector system depicted in FIG. 2.
Figure 4:
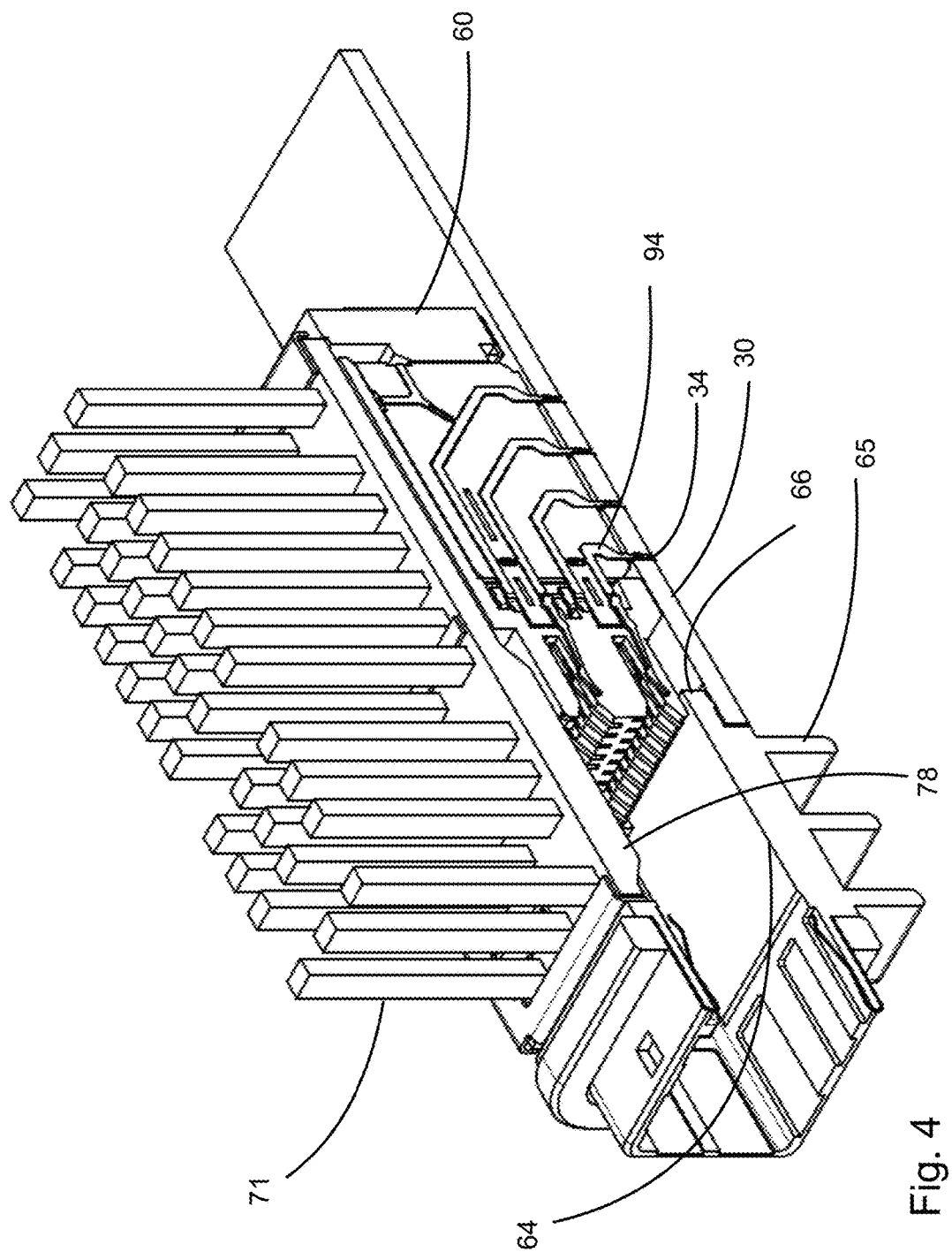
FIG. 4 illustrates a perspective view of a cross-section of an embodiment of receptacle.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

As depicted, one advantage of the system illustrated in FIGS. 1-6D is that when a module 100 (which can be an active module configured to enable an active copper or optical transceiver) is inserted into the cage 60 of a receptacle 50, a nose portion 110 is sandwiched between a riding heat sink 70 and a thermal plate 64. To create the force needed to ensure a suitable thermal connection, the riding heat sink is biased toward the thermal plate 64 with a clip 75 that used a retaining flange 79 to engage features on the cage 60 so as secure the clip 75 in place. Fingers 77 extend from the clip and press on a plate 73 of heat sink 71 so that surface 78 can make reliable contact with an inserted module and thermal fins 72 can dissipate heat. The fingers bias the surface downward toward the thermal plate and thus act as a biasing system to press an inserted module against the thermal plate 64. The thermal plate 64 can be positioned forward of the forward-most vias 34 in a circuit board 30 and as depicted is integral with the cage 60.

It should be noted that while the riding heat sink design is considered suitable for use with the depicted cage because it provides fingers that can adjustably bias the module toward the thermal plate, the cage can also be configured to be compatible with any mechanical system that can adjustably bias an inserted module toward the thermal plate. For example, the cage could include a closed top surface that had an adjustable biasing system such as springs that acted to press an inserted module toward the thermal plate. Thus, the riding heat sink 70 is merely one example of a possible adjustable biasing system and as the use of leaf springs and other biasing systems such as springs and compressible materials is well known is the mechanical arts; no further discussion of the adjustable biasing system is needed.

As can be appreciated, the depicted connector system allows thermal energy to be removed from both the top and bottom of the receptacle 50. To assist in removal of thermal energy, lower fins 65 can be mounted on the thermal plate 64. It should be noted that if included, fins 65 can be any desired orientation, it being understood that direction air flow over fins 65 is expected to be beneficial of heat dissipation. Thus, a single receptacle 50 can provide substantially greater surface area to dissipate thermal energy. To facilitate the lower fins 65, a notch 32 (often referred to as a cut-back) can be provided in the circuit board 30. However, as will be discussed further below, the fins are optional and may not be suitable for some applications.

As can be appreciated, the cage is positioned so as to extend around a housing 90 that includes one or more card slots 91. The card slots 91 have terminals 94 supported by the housing and mounted so as to be provided on both sides of the card slots so as to provide a desired compact receptacle structure/interface. In preferred embodiments, there is a first card slot 91 and a second card slot 92. To help ensure the cage and housing are aligned, a cage slot 69 can be provided that engages with a corresponding flange on the housing 90.

Figure 5:
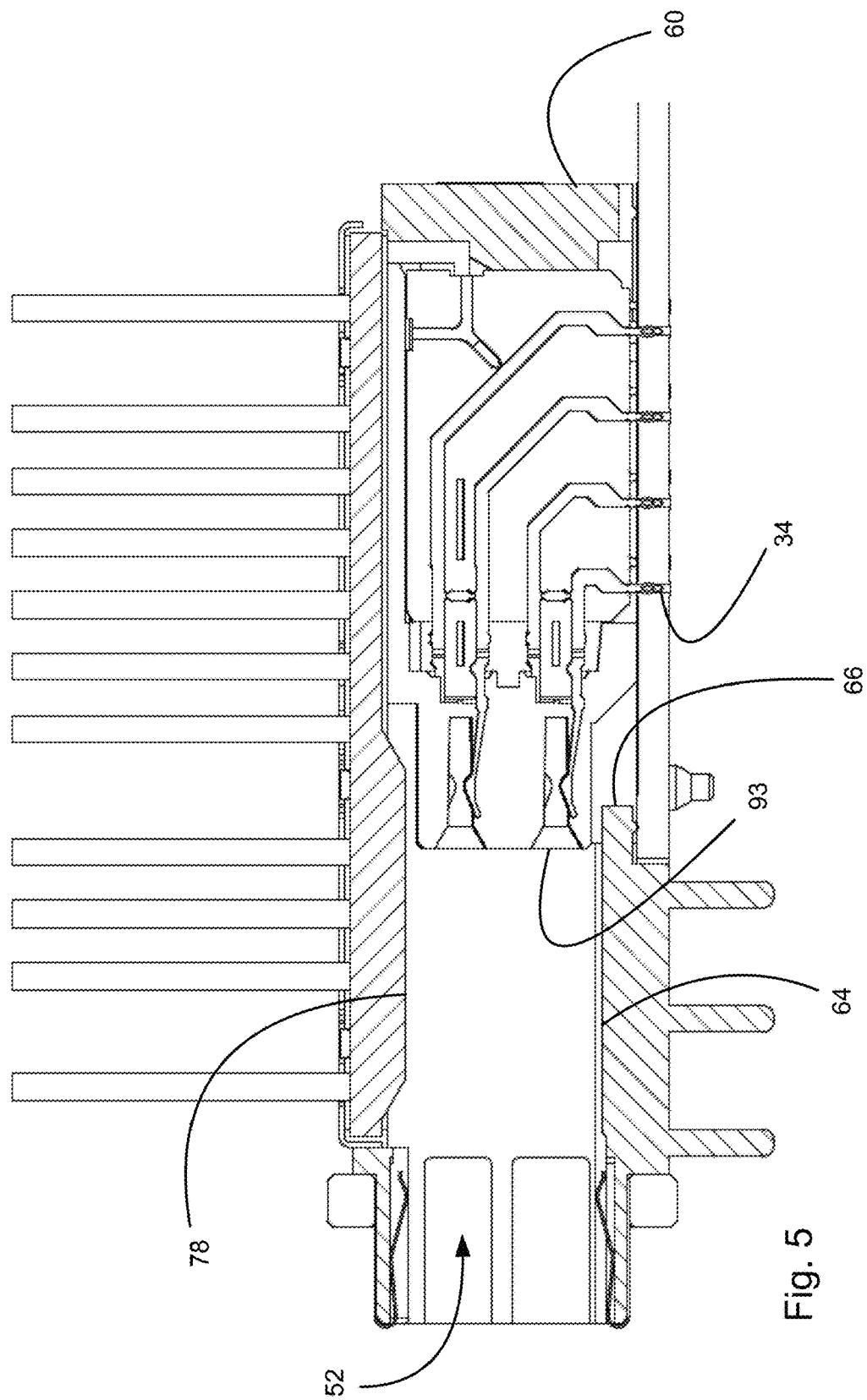
FIG. 5 illustrates an enlarged side view of the cross-section depicted in FIG. 4.
Figure 6A:
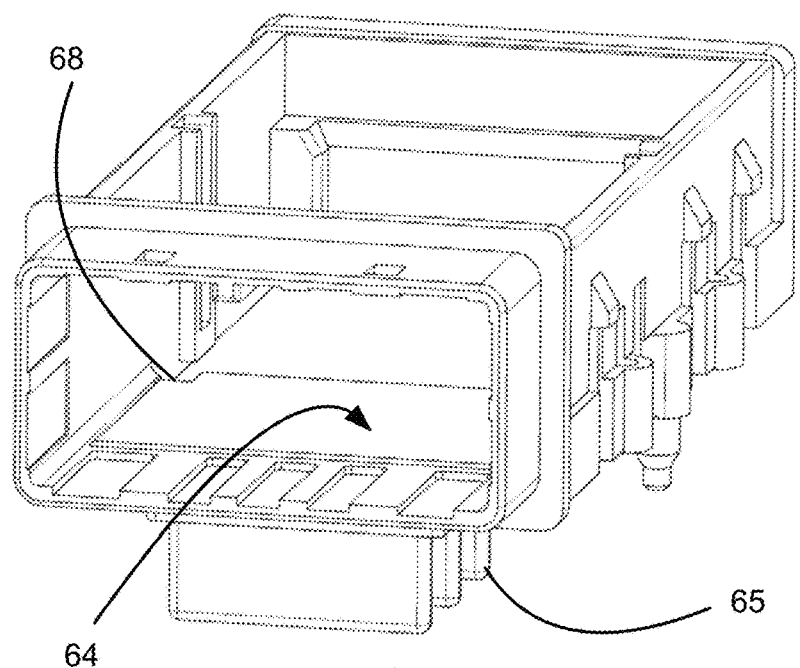
FIG. 6A illustrates a perspective view of an embodiment of a cage.
Figure 6B:
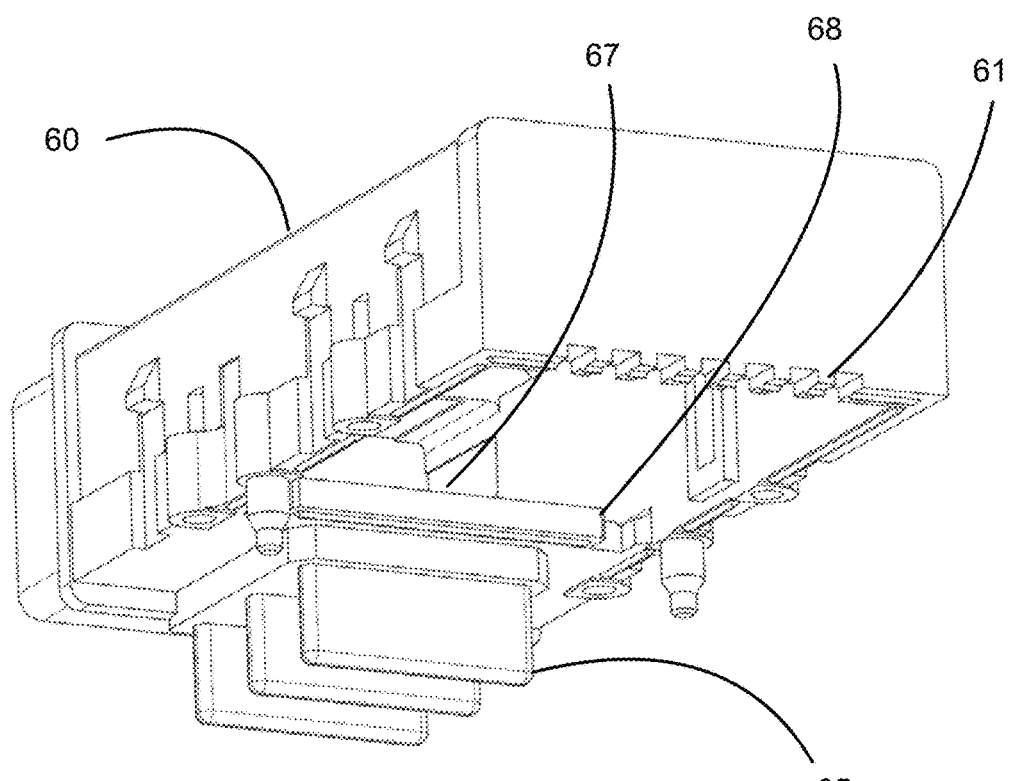
FIG. 6B illustrates another perspective view of an embodiment of a cage.
Figure 6C:
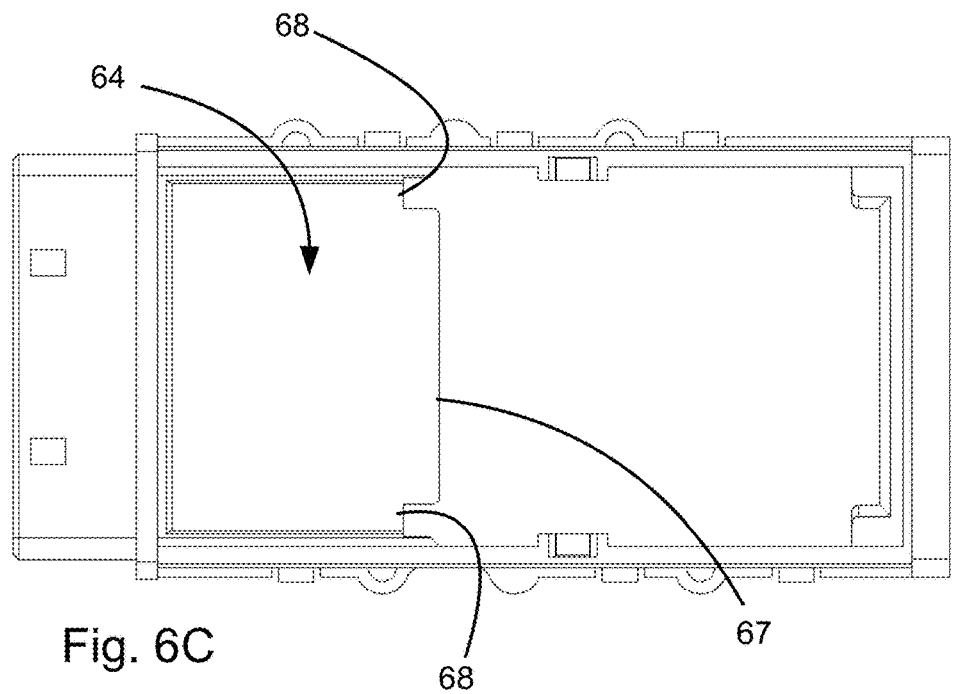
FIG. 6C illustrates a plan view of the cage depicted in FIG. 6A.
Figure 6D:
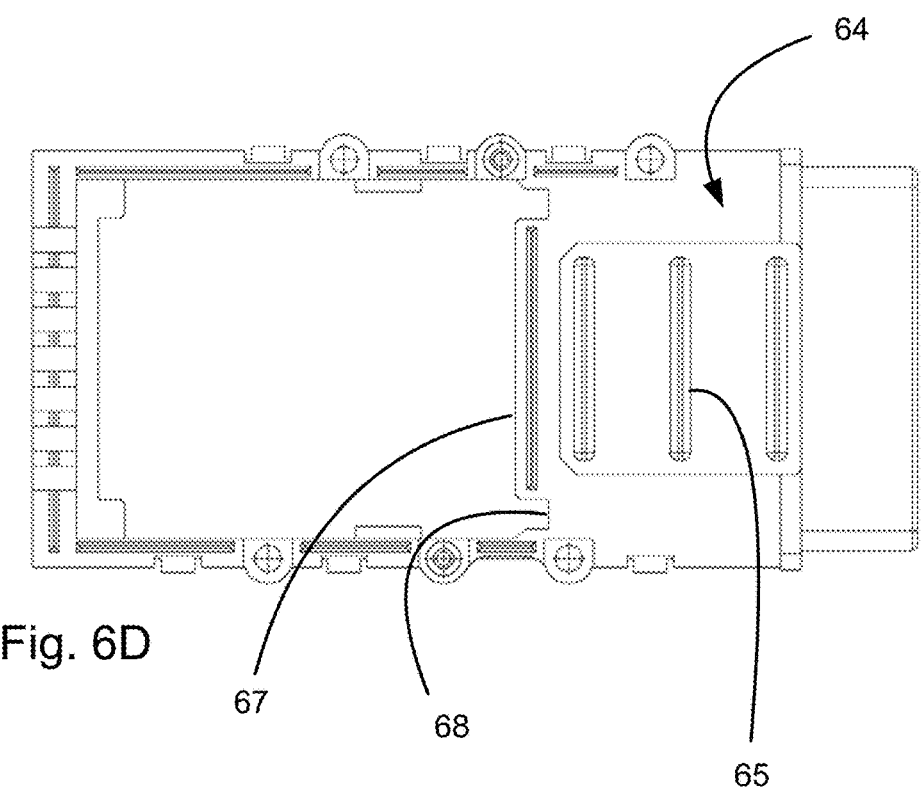
FIG. 6D illustrates a bottom view of the cage depicted in FIG. 6A.
Figure 7:
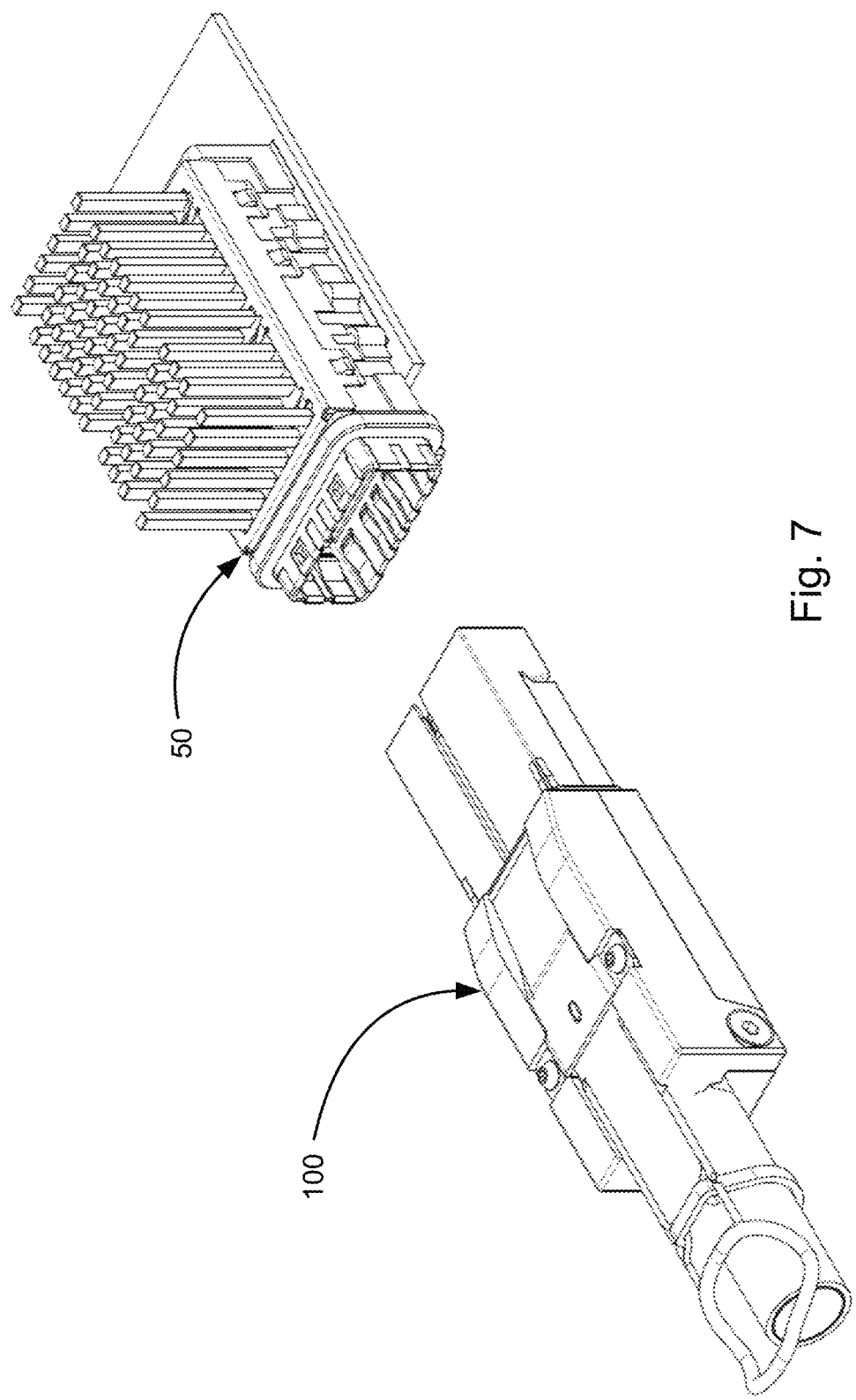
FIG. 7 illustrates a perspective view of an embodiment of a connector plug and receptacle in an unmated position.
Figure 8:
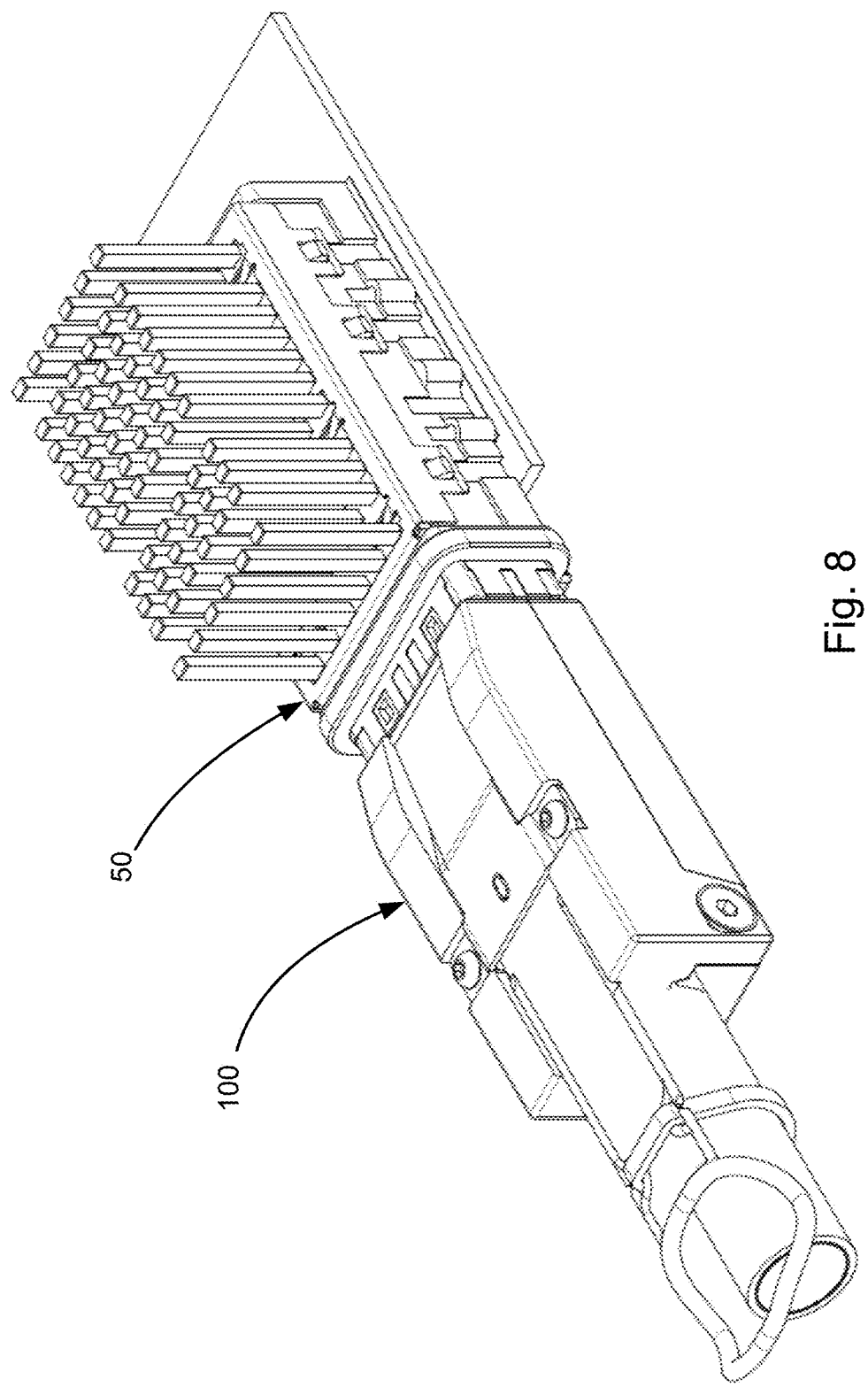
FIG. 8 illustrates a perspective view of the plug and receptacle depicted in FIG. 7 in a mated position.
Figure 9:
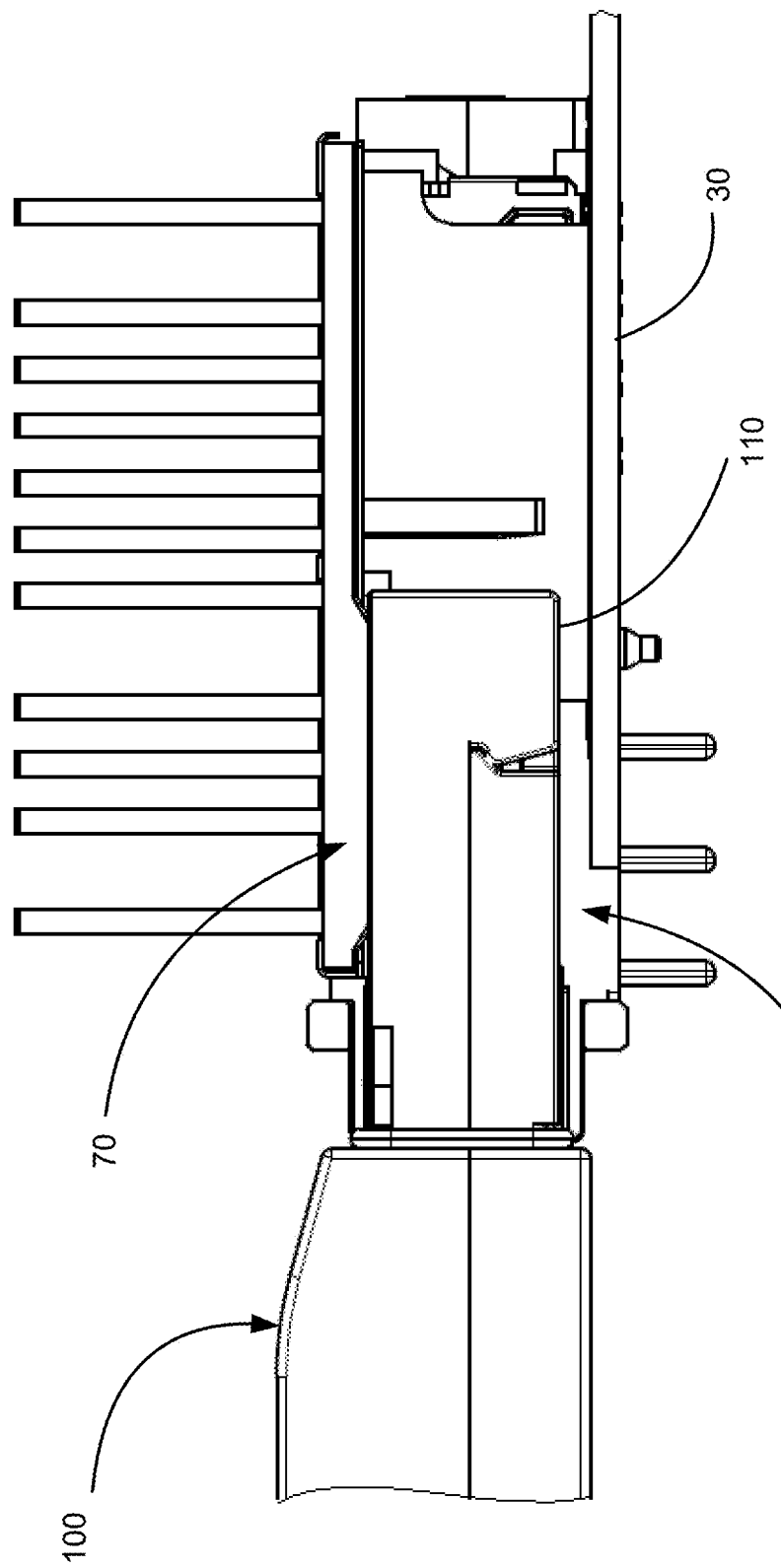
FIG. 9 illustrates an elevated side view of a cross-section of the plug and receptacle depicted in FIG. 8.

As can be appreciated from FIG. 5, the thermal plate 64 has an end 67 that extends back past the opening 93 provided for the card slots 91, 92. The thermal plate 64, however, can still allow for access to an alignment slot provided under the card slots, if the alignment slot is provided. The thermal plate 64 can have notches 68 that help align the thermal plate 64 with such alignment slots. The cage 60 may also have back notches 61 that allow for some thermal energy to dissipate out the rear of the cage 60 and because of their pointed ends, also provide a good interface for being soldered to a pad on a supporting circuit board.

While fins are suitable for transferring thermal energy in certain applications, in other system architectures it can be challenging to provide sufficient air flow. Furthermore, in certain applications there is insufficient space for fins and/or there is little or no air flow over the lower portion of the circuit board. In such a situation, the thermal plate may be provided to help route thermal energy from the bottom of the inserted module to a portion of the cage that is better configured for thermal dissipation.

Figure 10:
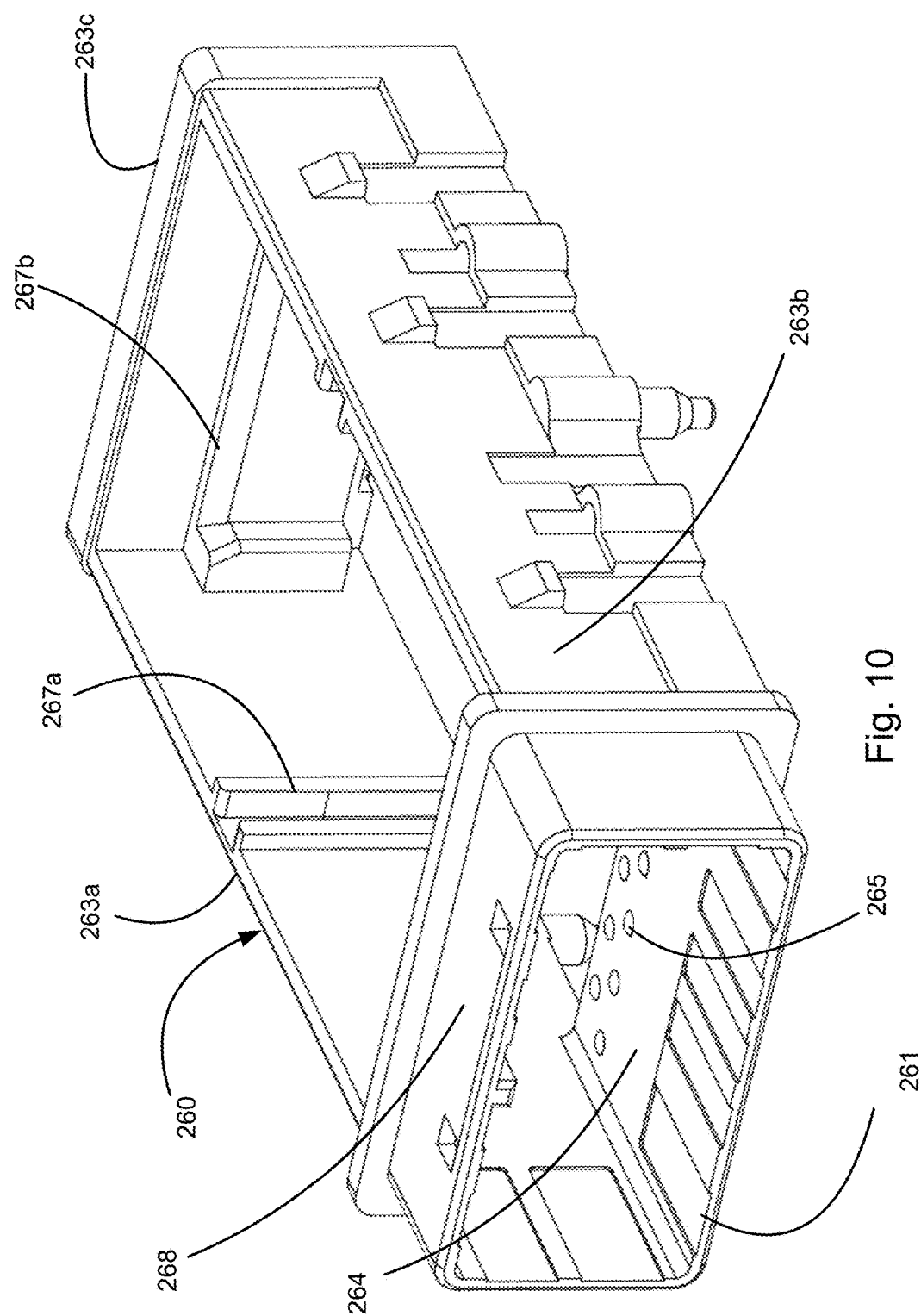
FIG. 10 illustrates a perspective view of another embodiment of a cage.
Figure 11:
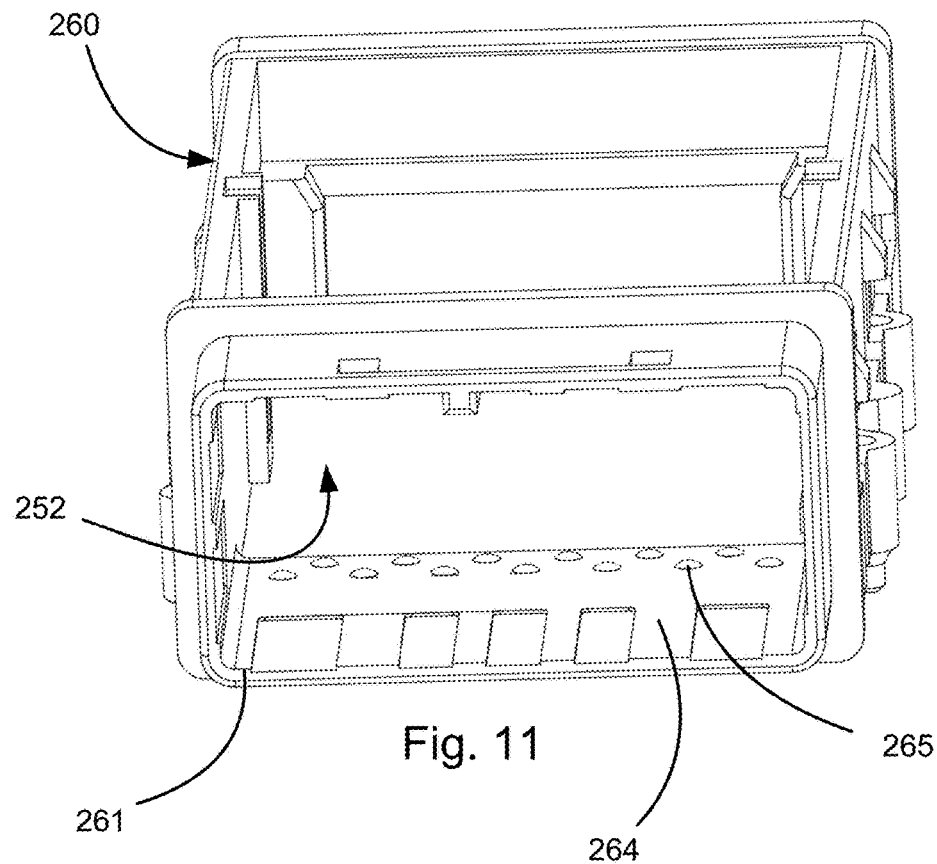
FIG. 11 illustrates another perspective view of the embodiment depicted in FIG. 10.
Figure 12:
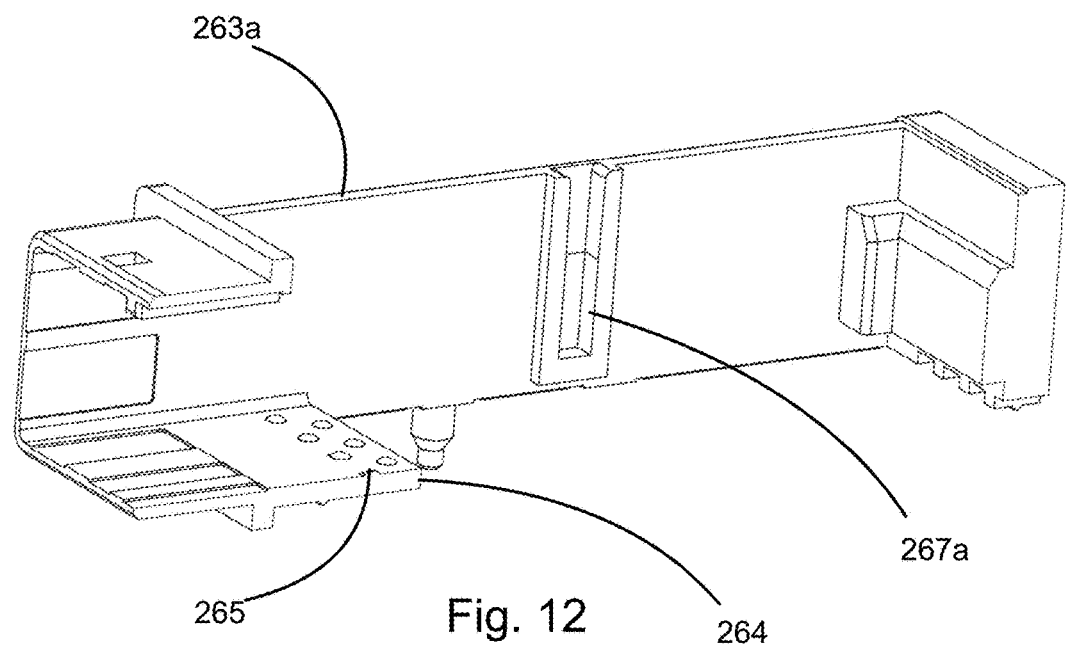
FIG. 12 illustrates a perspective view of a cross-section of the cage depicted in FIG. 10 taken along line 12-12.

Looking at FIGS. 10-12, for example, a cage 260 is disclosed that includes a first side wall 263a, a second side wall 263b, a rear wall 263c and a top wall 268. The cage 260 includes a front face 261 that defines a front of a channel 261 into which a module can be inserted. A thermal plate 264 extends back from the front face 261 and includes a plurality of projections 265 that are configured to engage an inserted module. It should be noted that the cage depicted in FIGS. 1-6D did not include the projections 265. While not required, the projections 265 provide a number of points of contact with the module and for situations where the module and/or thermal plate is not sufficiently flat, the projections 265 may offer better thermal coupling between the inserted module and the thermal plate then a design of a thermal plate and module were both are intended to be flat but due to tolerances were not. As in the prior embodiment, the cage includes an alignment slot 267a and may also include an alignment shoulder 267b.

Figure 13:
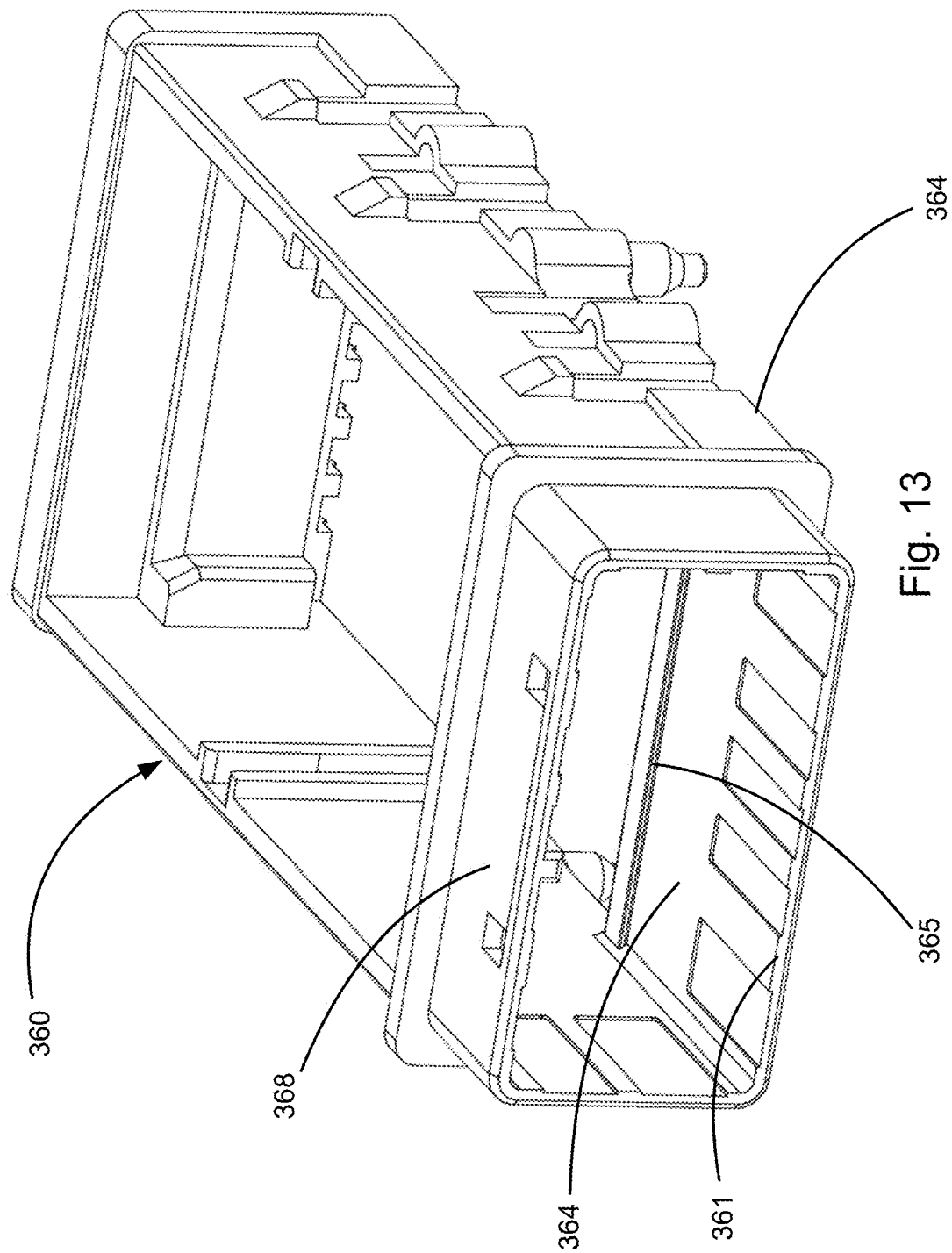
FIG. 13 illustrates a perspective view of another embodiment of a cage.

FIG. 13 illustrate another embodiment of a cage 360 that includes the front face 361 with a thermal plate 364 extending back from the front face 361. A thermal coupling bar 365 can be provided to make contact with an inserted module and, like the projections 265, can offer a higher pressure contact force that helps ensure the thermal plate 364 reliably engages with an inserted module.

In addition to examples where air flow is difficult to provide, in certain configurations, such as a ganged configuration, the cage may be intended to be positioned so that there is minimal space below the circuit board, thus making it extremely difficult to provide sufficient air flow under the cage. Alternatively, a stacked configuration (particularly a stacked, ganged configuration) could have fins on a top (or even on the top and bottom if a belly-to-belly configuration was used) but would still have a problem dissipating thermal energy from between the two receptacles formed by the stacked configuration. And in a conventional stacked configuration with only the top heat sink all the heat needs to be dissipated through the top of the connector, thus making it difficult to dissipate higher levels of thermal energy possible with active and optical modules.

Figure 14:
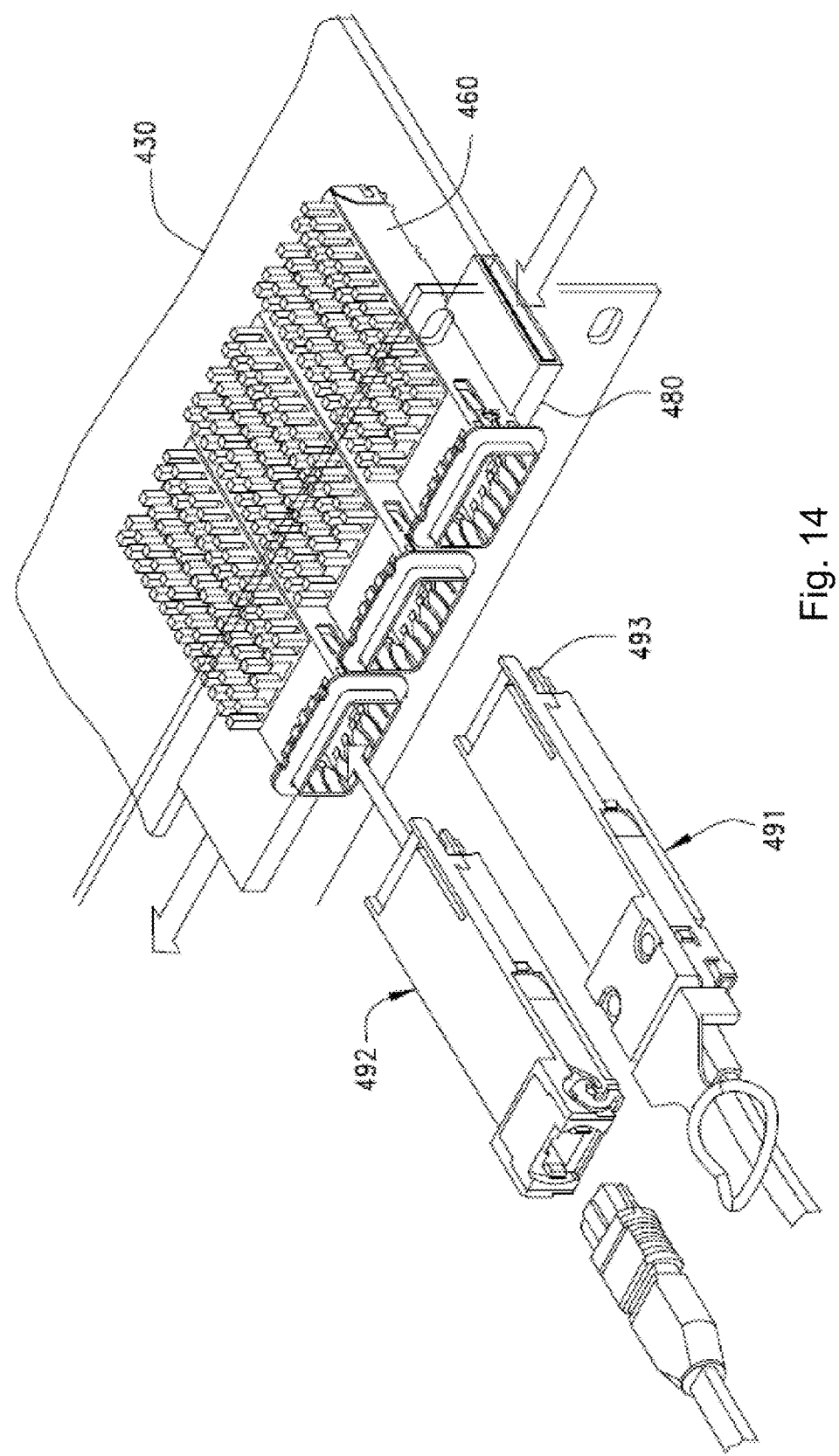
FIG. 14 illustrates a perspective view of an embodiment of a connector system.

Therefore, as can be appreciated from FIGS. 14-17, alternative configurations can provide a channel that directs a thermally conductive flow past an inserted module. FIG. 14, for example, illustrates a 460 configured to provide a ganged connector positioned on a circuit board 430. A thermal conduit 480 is positioned along a lower surface of the cage 460 and can help remove heat from the corresponding receptacle when modules, such as module 491 or module 492, are inserted therein. As is known, the each module includes an edge card, such as edge card 493 that is configured to be positioned in the card slot of the corresponding housing.

Figure 15:
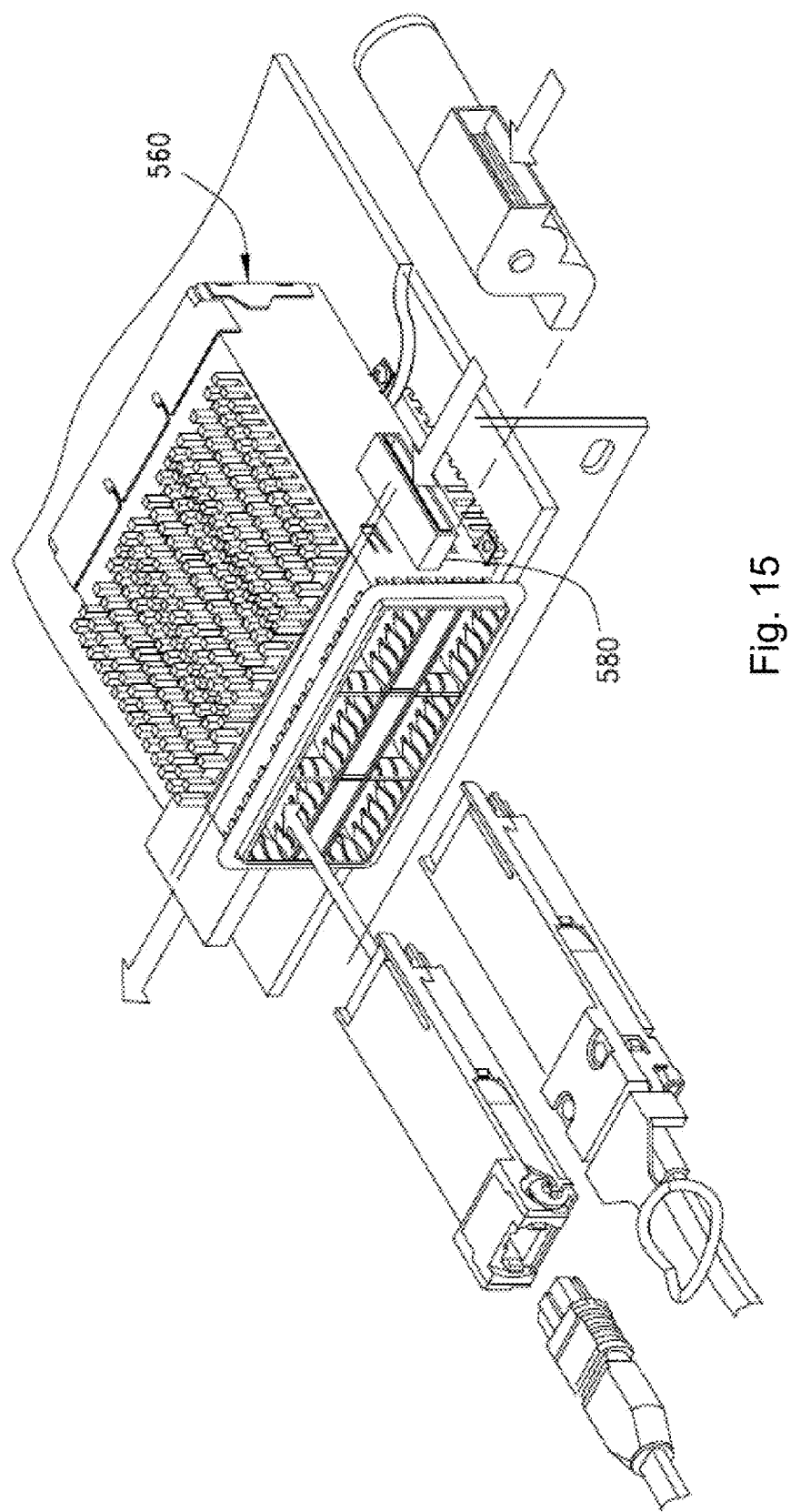
FIG. 15 illustrates a perspective view of another embodiment of a connector system.

FIG. 15 depicts a connector system with a cage 560 that is configured for a ganged and stacked configuration. To help provide cooling of the modules, a thermal conduit 580 extends through the center of the cage 560 and, in operation, engages a bottom of the upper module and a top of the lower module when the upper and lower module are inserted.

Figure 16:
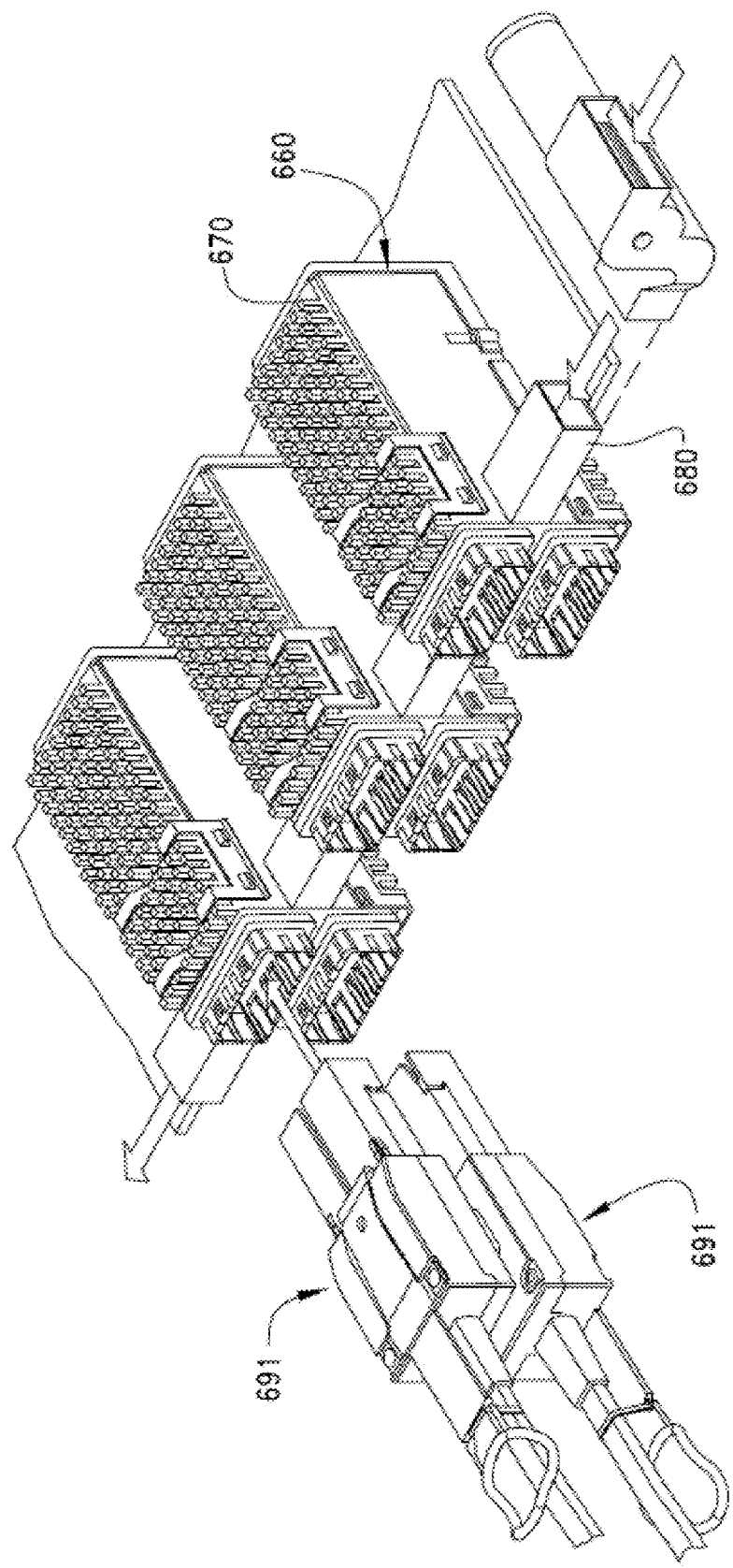
FIG. 16 illustrates a perspective view of another embodiment of a connector system.

FIG. 16 illustrates a connector system similar to that depicted in FIG. 15 in that cage 660 is stacked but the cage is not a ganged cage. Furthermore, the lower module 691 is inserted upside down compared to the upper module 691. The depicted configuration still uses two riding heat sinks but an upper heat sink 670 lower heat sink may be longer in length because of the circuit board. A thermal conduit 680 extends through the cage 660 and, because the modules are inserted in opposite orientation, can engage the same surface of the module regardless of whether the module inserted in the upper or lower port.

Figure 17:
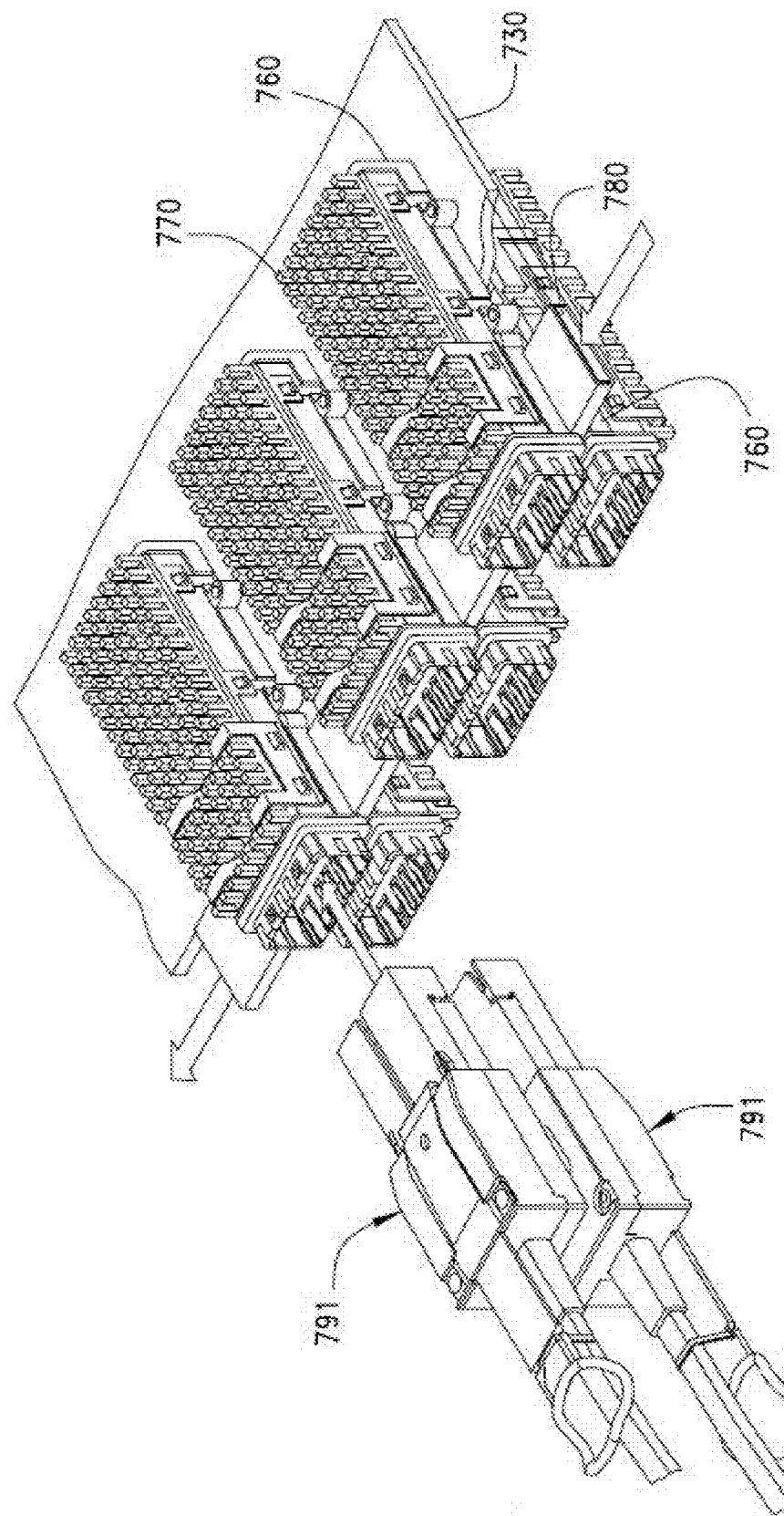
FIG. 17 illustrates a perspective view of another embodiment of a connector system.

FIG. 17 illustrates another embodiment of a connecter system with a cage 760 and a cage 760' mounted on opposite sides of a circuit board 730. The two cages are both configured with riding heat sinks 770 and a thermal conduit 780 extends between the two cages and in line with circuit board 730.

In either a ganged or stacked configuration, therefore, the thermal plate can be positioned so as to engage a side of the module that would typically be not in contact with a thermally conductive portion of the receptacle and the thermal conduit can remove heat from the thermal plate. As can be appreciated, the conductive flow through the thermal conduit could be any desirable medium such as a gas or liquid (e.g., air or water). In addition, if desired, a portion (which could range from a small amount to all) of the thermal plate could be replaced with a thermal conduit channel and in an embodiment the thermal conduit could function as the thermal plate for two receptacles that were stacked. For example, in the stacked configuration a top surface of the thermal conduit could engage a first side of a first module and a bottom surface of the thermal conduit could engage a first side of a second module.

The disclosure provided herein describes features in terms of preferred and exemplary embodiments thereof. Numerous other embodiments, modifications and variations within the scope and spirit of the disclosure will occur to persons of ordinary skill in the art from a review of this disclosure.

We claim:

1. A method of cooling a connector system, comprising:
providing a connector on a circuit board, the connector including a cage that extends around a housing, the housing supporting at least two card slots on a front of the housing, the at least two card slots being spaced apart in a vertical manner, the cage defining two ports that are each respectively aligned with one of the at least two card slots, the ports being defined by walls and configured to allow a mating module to be inserted therein in a first direction so as to allow for engagement with the housing;
providing a thermal conduit between the two ports that allows air to flow substantially unhindered by the cage past the two ports in a direction that is transverse to the first direction and then out of the cage; and
directing air through the thermal conduit.

2. The method of claim 1, wherein the connector includes at least one thermal plate aligned with the thermal conduit and configured to engage an inserted module.

3. The method of claim 1, wherein the connector further includes at least one riding heat sink.

4. The method of claim 1, wherein the connector is a ganged connector that includes two columns of ports, each column having two ports that are vertically separated and the thermal conduit extends between the vertically separated ports.

5. The method of claim 1, wherein the connector includes at least three columns of ports, each column having two ports that are vertically separated and the thermal conduit extends between the vertically separated ports.

6. The method of claim 1, wherein the thermal conduit is configured to directly contact the mating module when the mating module is inserted into the respective port.

* * * * *